United States Patent
Fritzemeier et al.

(10) Patent No.: US 6,426,320 B1
(45) Date of Patent: Jul. 30, 2002

(54) LOW VACUUM VAPOR PROCESS FOR PRODUCING SUPERCONDUCTOR ARTICLES WITH EPITAXIAL LAYERS

(75) Inventors: Leslie G. Fritzemeier, Acton; David M. Buczek, Dover, both of MA (US)

(73) Assignee: American Superconductors Corporation, Westborough, MA (US)

(*) Notice: Subject to any disclaimer, the term of this patent is extended or adjusted under 35 U.S.C. 154(b) by 0 days.

(21) Appl. No.: 09/474,519

(22) Filed: Dec. 29, 1999

Related U.S. Application Data

(63) Continuation of application No. 09/007,367, filed on Jan. 15, 1998, now Pat. No. 6,022,832.
(60) Provisional application No. 60/059,604, filed on Sep. 23, 1997.

(51) Int. Cl.[7] ............................................... C30B 25/14
(52) U.S. Cl. .................. 505/461; 505/123; 505/729; 505/731; 117/89; 117/90; 117/91; 117/102; 117/105
(58) Field of Search ................... 505/461, 123, 505/789, 729, 731; 117/89, 90, 91, 102, 105

(56) References Cited

U.S. PATENT DOCUMENTS

| | | | |
|---|---|---|---|
| 1,823,938 A | 9/1931 | Henke | |
| 2,739,907 A | 3/1956 | Nowak et al. | 117/106 |
| 3,109,331 A | 11/1963 | Cordray et al. | 80/60 |
| 3,615,917 A | 10/1971 | Shin et al. | 148/111 |
| 3,648,355 A | 3/1972 | Shida et al. | 29/471.7 |

(List continued on next page.)

FOREIGN PATENT DOCUMENTS

| | | |
|---|---|---|
| CA | 697916 | 11/1964 |
| EP | 0 410 373 A2 | 1/1991 |
| EP | 0 312 015 B1 | 12/1992 |
| EP | 0 341 788 B1 | 8/1993 |
| JP | 1-100820 | 10/1987 |
| JP | 6-139848 | 5/1994 |
| WO | WO 96/32201 | 10/1996 |

OTHER PUBLICATIONS

Doi et al., "A New Type of Superconducting Wire: Biaxially Oriented $Tl_1$ $(Ba_{0.8}Sr_{0.2})$ . . . ," Advances in Superconductivity VII, pp. 817–820.

Ginsbach, A et al., "Growth of C–Axis Oriented YBaCuO Films on Oxidized Textured Ni Sheets and on (100) and (110) Oriented NiO Single Crystals," IEEE Transactions on Magnetics, vol. 27, No. 2, pp. 1410–1413 (3/91).

Smallman et al., "Advances in the theory of deformation and recrystallization texture formation," Materials Science and Engineering, A184, pp. 97–112 (1994).

Yoshino et al., "Improvement of In–Plane Alignment of Grains in YBCO Films on Ag Tapes," Advances in Superconductivity VI, pp. 759–762.

Budai et al., "In–plane epitaxial alignment of $YBa_2Cu_3O_{7-x}$ films grown on silver crystals and buffer layers," Appl. Phys. Lett. 62 (15), pp. 1836–1838 (Apr. 1993).

Feldman et al., "Epitaxial Growth of A15 $Nb_3Si$," IEEE Transactions on Magnetics, vol. Mag–17, No. 1, pp. 545–548 (Jan. 1981).

(List continued on next page.)

*Primary Examiner*—Robert Kunemund
(74) *Attorney, Agent, or Firm*—Fish & Richardson, P.C.

(57) ABSTRACT

A method for fabricating superconductor articles with an epitaxial layer is described. The method can be performed under conditions of relatively high pressure and low substrate surface temperature. The resulting epitaxial layers can demonstrate various advantageous features, including low pore density and/or inclusions with small average particle size diameter.

71 Claims, 10 Drawing Sheets

U.S. PATENT DOCUMENTS

| | | | |
|---|---|---|---|
| 3,700,427 A | 10/1972 | Hoppin, III et al. | 75/0.5 R |
| 3,713,211 A | 1/1973 | Freeman, Jr. | 29/599 |
| 3,770,497 A | 11/1973 | Hässler et al. | 117/212 |
| 3,778,237 A | 12/1973 | Shapiro et al. | 29/199 |
| 3,845,543 A | 11/1974 | Roth et al. | 29/472.3 |
| 4,024,617 A | 5/1977 | McCormick | 29/156.63 |
| 4,105,828 A | 8/1978 | Borchert et al. | 428/665 |
| 4,145,481 A | 3/1979 | Gupta et al. | 428/678 |
| 4,246,321 A | 1/1981 | Shibata | 428/614 |
| 4,367,102 A | 1/1983 | Wilhelm | 148/133 |
| 4,416,916 A | 11/1983 | Aykan et al. | 427/160 |
| 4,431,462 A | 2/1984 | Gould et al. | 148/11.5 Q |
| 4,537,642 A | 8/1985 | Saito et al. | 148/11.5 Q |
| 4,734,451 A | 3/1988 | Smith | |
| 4,749,628 A | 6/1988 | Ahlert et al. | 428/660 |
| 4,788,082 A | 11/1988 | Schmitt | 427/248.1 |
| 4,909,859 A | 3/1990 | Nazmy et al. | 148/11.5 N |
| 4,917,967 A | 4/1990 | Cupolo et al. | 428/669 |
| 4,939,308 A | 7/1990 | Maxfield et al. | 505/1 |
| 4,980,341 A | 12/1990 | Gehring | 505/1 |
| 4,994,435 A | 2/1991 | Shiga et al. | 505/1 |
| 5,006,507 A | 4/1991 | Woolf et al. | 505/1 |
| 5,019,552 A | 5/1991 | Balooch et al. | 505/1 |
| 5,059,582 A | 10/1991 | Chung | 505/1 |
| 5,074,907 A | 12/1991 | Amato et al. | 75/235 |
| 5,102,865 A | 4/1992 | Woolf et al. | 505/1 |
| 5,110,790 A | 5/1992 | Feenstra et al. | 505/1 |
| 5,147,849 A | 9/1992 | Tanaka et al. | 505/1 |
| 5,164,360 A | 11/1992 | Woolf et al. | 505/1 |
| 5,198,043 A | 3/1993 | Johnson | 148/512 |
| 5,204,313 A | 4/1993 | Lelental et al. | 505/1 |
| 5,206,216 A | 4/1993 | Yoshida | 505/1 |
| 5,212,148 A | 5/1993 | Roas et al. | 505/1 |
| 5,225,031 A | 7/1993 | McKee et al. | 156/612 |
| 5,231,074 A | 7/1993 | Cima et al. | 505/1 |
| 5,238,752 A | 8/1993 | Duderstadt et al. | 428/623 |
| 5,240,905 A | 8/1993 | Tanaka et al. | 505/1 |
| 5,248,662 A | 9/1993 | Yoshida et al. | 505/1 |
| 5,256,205 A | 10/1993 | Schmitt, III et al. | 118/723 |
| 5,258,364 A | 11/1993 | Yamazaki | 505/1 |
| 5,270,294 A | 12/1993 | Wu et al. | 505/1 |
| 5,273,959 A | 12/1993 | Lambert et al. | 505/1 |
| 5,290,761 A | 3/1994 | Keating et al. | 505/1 |
| 5,312,804 A | 5/1994 | Petibon et al. | 505/434 |
| 5,330,966 A | 7/1994 | Hayashi et al. | 505/473 |
| 5,340,792 A | 8/1994 | Ovshinsky et al. | 505/123 |
| 5,356,672 A | 10/1994 | Schmitt, III et al. | 427/446 |
| 5,356,673 A | 10/1994 | Schmitt et al. | 427/446 |
| 5,358,895 A * | 10/1994 | Steele et al. | |
| 5,360,784 A | 11/1994 | Kimura et al. | 505/433 |
| 5,372,089 A | 12/1994 | Yoshida et al. | 117/98 |
| 5,378,683 A | 1/1995 | Cabanel et al. | 505/190 |
| 5,379,019 A | 1/1995 | Fiddes et al. | 335/216 |
| 5,426,092 A | 6/1995 | Ovshinsky et al. | 505/461 |
| 5,427,866 A | 6/1995 | Nagaraj et al. | 428/610 |
| 5,432,151 A | 7/1995 | Russo et al. | 505/474 |
| 5,434,130 A | 7/1995 | Hikata et al. | 505/433 |
| 5,470,668 A | 11/1995 | Wu et al. | 428/688 |
| 5,482,578 A | 1/1996 | Rose et al. | 148/516 |
| 5,527,765 A | 6/1996 | Hodge et al. | 505/236 |
| 5,545,612 A | 8/1996 | Mizushima et al. | 505/239 |
| 5,571,332 A | 11/1996 | Halpern | 118/723 |
| 5,629,268 A | 5/1997 | Tanaka et al. | 505/329 |
| 5,645,893 A | 7/1997 | Rickerby et al. | 427/405 |
| 5,648,321 A | 7/1997 | Bednorz et al. | 505/473 |
| 5,650,378 A | 7/1997 | Iijima et al. | 505/473 |
| 5,660,746 A | 8/1997 | Witanachchi et al. | 219/121.66 |
| 5,667,663 A | 9/1997 | Rickerby et al. | 205/170 |
| 5,672,569 A | 9/1997 | Nakamura et al. | 505/330 |
| 5,693,140 A | 12/1997 | McKee et al. | 117/108 |
| 5,696,392 A | 12/1997 | Char et al. | 257/190 |
| 5,703,341 A | 12/1997 | Lowndes et al. | 219/121.66 |
| 5,964,966 A | 10/1999 | Goyal et al. | 148/426 |
| 5,968,877 A | 10/1999 | Budai et al. | 505/237 |
| 6,022,832 A | 2/2000 | Fritzemeier et al. | |
| 6,027,564 A | 2/2000 | Fritzemeier et al. | |

OTHER PUBLICATIONS

Ginsbach et al., "Electrical and Structural Properties of $YBa_2Cu_3O_7$ Films on PO and Single Crystalline Oxides of Cu and Ni," Physica C 185–189 pp. 2111–2112 (1991).

Goyal, "Advances in Processing High–$T_C$ Superconductors for Bulk Applications," JOM p. 11 (Dec. 1994).

Goyal, "Progress Toward Bulk Application of High–$T_C$ Supeconductors," JOM p. 55 (Aug. 1995).

Norton et al., "Epitaxial $YBa_2Cu_3O_7$ on Biaxially Textured Nickel (001): An Approach to Superconducting Tapes with High Critical Current Density," Science, vol. 274 p. 755 (Nov. 1996).

Schlom et al., "Origin of the ø≈±9° Peaks in $YBa_2Cu_3O_8$ Films Grown on Cubic Zirconia Substrates," H13.49 p. 272.

Budai et al., "In–plane Alignment of YBaCuO Films on Metal Substrates and Buffer Layers," H13.52, p. 272.

Norton et al., "Superconducting Transport Properties and Surface Microstructure for $YBa_2Cu_3O_8$ Based Superlattices . . . ," Submitted to Workshop on Laser Ablation Mechanisms and Applications (May 1991).

Norton et al., "$YBa_2Cu_3O_{7-x}$ Thin Film Growth on Single Crystal and Polycrystalline Yttria–Stabilized Zirconia," Submitted to the Conf. on Science and Technology of Thin–Film Superconductors (Apr. 1990).

Christen et al., "Transport Critical Currents in Epitaxial . . . Thin Films," prepared by the Solid State Division Oak Ridge National Laboratory (Jul. 1989).

Undated Report.

Final Report dated Apr. 22, 1996.

Dionne et al., "Magnetic and Stress Characterization of Nickel Ferrite Ceramic Films Grown by Jet Vapor Deposition,".

* cited by examiner

LOW VACUUM VAPOR PROCESS FOR PRODUCING SUPERCONDUCTOR ARTICLES WITH EPITAXIAL LAYERS

This application is a continuation under 35 U.S.C. § 120 to U.S. patent application Ser. No. 09/007,367, filed Jan. 15, 1998, and entitled, "Low Vacuum Process For Producing A Superconductor Articles With Epitaxial Layers," now U.S. Pat. No. 6,022,832, which, in turn, claims priority under 35 U.S.C. § 120 to U.S. Provisional Patent Application No. 60/059,604, filed Sep. 23, 1997, and entitled, "Low Vacuum Process For Producing Epitaxial Layers."

BACKGROUND OF THE INVENTION

The invention relates to methods of making superconductors having epitaxial layers.

Superconductors are used in a variety of applications. Often, the mechanical integrity of a superconductor can be enhanced by forming a multilayer article that includes a layer of superconductor material and a substrate layer, but the use of a substrate can present certain complications.

Chemical species within the substrate may be able to diffuse into the layer of superconductor material, potentially resulting in a loss of superconductivity. Moreover, the coefficients of thermal expansion as well as the crystallographic spacing and orientation of the substrate and the superconductor layer can be different, causing the article to peel apart during use.

To minimize these complications, a buffer layer can be disposed between the substrate and the superconductor layer. The buffer layer should reduce diffusion of chemical species between the substrate and the superconductor layer, and the buffer layer should have a thermal coefficient of expansion that is about the same as both the substrate and the superconductor layer. In addition, the buffer layer should provide a good crystallographic match between the substrate and the superconductor.

One approach to controlling the crystallographic properties of a layer has been to use epitaxy. An epitaxial layer is a layer of material that is grown on the surface of a substrate such that the crystallographic orientation of the layer of material is determined by the lattice structure of the substrate. By epitaxy is also meant materials with ordered surfaces whether formed by conventional epitaxy or graphoepitaxy. Epitaxial layers have been grown using physical vapor deposition (PVD), chemical vapor deposition (CVD) and sputtering techniques.

Typically, PVD involves the evaporation of a solid material and transfer of the vapor to the substrate surface in a diffuse gas beam in which only a small portion of the total amount of evaporated solid may reach the substrate surface. Thus, the material usage efficiencies obtained with PVD can be low. In addition, PVD is usually performed at a chamber pressure of at most about $1 \times 10^{-4}$ torr, so the flux of evaporated solid at the substrate surface can be small, resulting in low epitaxial layer growth rates.

In CVD, one or more reactant gases within the chamber adsorb to the substrate surface and react to form the epitaxial layer with product gases desorbing from the substrate surface. Generally, the reactant gases reach the substrate surface by convection and diffusion, so the *material usage efficiencies can be low. Furthermore, CVD is typically conducted at a chamber pressure of at least about 0.1 torr, and, to grow epitaxial layers at these elevated pressures, relatively high substrate temperatures are usually used. Thus, the selection of substrate materials used in CVD can be limited.

Sputtering methods of growing epitaxial layers can also be limited by the aforementioned considerations.

When using PVD, CVD or a sputtering technique, the quality of the epitaxial layer can depend upon the chemical nature of the substrate surface during layer growth. For example, contaminants present at the substrate surface can interfere with epitaxial layer growth. In addition, native oxides present at the substrate surface can help or hinder epitaxial layer growth. Further, PVD, CVD and sputtering methods can be ineffective at providing control of the chemical nature of the substrate surface during layer growth, so the epitaxial layers formed by these techniques can be of poor quality.

SUMMARY OF THE INVENTION

The invention features a low vacuum vapor deposition process for producing a superconductor article with an epitaxial layer. The epitaxial layer is disposed on a substrate that can be of non-identical composition.

In one aspect the invention features a method that includes the steps of placing a textured or crystallographically oriented target surface of a substrate typically including contaminant materials, in a low vacuum environment, and heating the target surface (substrate surface) to a temperature which is greater than the threshold temperature for forming an epitaxial layer of the desired material on the substrate material in a high vacuum environment under otherwise comparable conditions. A layer-forming stream, including an inert carrier gas and a dispersion of a first species (layer forming gas), which is a chemical component of the desired epitaxial layer, is directed at a positive velocity greater than about 1 m/sec toward the substrate surface through the low vacuum environment. A second species (conditioning gas) is provided in the low vacuum environment, directed toward the substrate surface at a velocity substantially similar to the velocity of the layer-forming stream, and reacted with one or more of the species present in the substrate surface, for example, a contaminant material. This reaction conditions the substrate surface and promotes nucleation of the epitaxial layer. A desired material chemically comprising the first layer forming gas is deposited from the stream onto the substrate surface to form an epitaxial layer. A layer of an oxide superconductor is then deposited on the epitaxial layer.

As used herein, "layer forming gas" refers to a gas that can adsorb to a surface and become a component of an epitaxial layer. A layer forming gas can be formed of atoms, molecules, ions, molecular fragments, free radicals, atomic clusters and the like.

As used herein, "conditioning gas" refers to a gas that can interact with a surface to remove surface contaminants, remove undesired native oxides present at the substrate surface or form desired native oxides or other components at the substrate surface. A conditioning gas can be formed of atoms, molecules, ions, molecular fragments, free radicals, atomic clusters and the like.

In another aspect, the invention features a method of making a superconductor. The method includes growing, at a chamber pressure of at least about $1 \times 10^{-3}$ torr, an epitaxial buffer layer on a substrate having a temperature that is about the same as a PVD epitaxial growth threshold temperature for a chamber pressure of at most about $1 \times 10^{-4}$ torr. The method also includes depositing a superconductor material or a precursor of a superconductor material on the epitaxial buffer layer.

A "precursor of a superconductor material" as used herein refers to a material which can undergo subsequent treatment to become a superconductor. For example, subsequent to heating a particular temperature, a precursor of a superconductor material can become a superconductor material.

For a given epitaxial layer, the "PVD epitaxial growth threshold temperature for a chamber pressure of at most about $1\times10^{-4}$ torr" refers to the minimum substrate temperature that can be used to grow the epitaxial layer at a chamber pressure of at most about $1\times10^{-4}$ torr, typically at most about $1\times10^{-5}$ torr, using a PVD with a diffuse gas beam.

As used herein, a "diffuse gas beam" refers to a gas beam in which less than about 50% of any layer forming gas in the gas beam is incident at the substrate surface.

In still another aspect, the invention features a method of making a superconductor. The method includes growing an epitaxial buffer layer on a substrate surface at a rate of at least about 50 Angstroms per second in a vacuum chamber having a pressure of at least about $1\times10^{-3}$ torr. The method also includes depositing a layer of superconductor material or a precursor of a superconductor material on the epitaxial buffer layer.

In a further aspect, the invention features a method of making a superconductor. The method includes growing an epitaxial buffer layer on a substrate surface by exposing the substrate surface to a gas beam having a layer forming gas, wherein at least about 75% of the layer forming gas in the gas beam is incident at the substrate surface. The method also includes depositing a layer of superconductor material or a precursor of a superconductor material on the epitaxial buffer layer.

In still a further aspect, the invention features a method of making a superconductor. The method includes forming an epitaxial buffer layer by exposing a surface of a substrate to a conditioning gas that interacts with the substrate surface to form a conditioned substrate surface and exposing the conditioned substrate surface to a gas beam having a layer forming gas that becomes a component of an epitaxial buffer layer on the conditioned substrate surface. The exposing steps are performed at a pressure of at least about $1\times10^{-3}$ torr. The method further includes depositing a layer of a superconductor material or a precursor of a superconductor material on the buffer layer.

A "conditioned surface" herein denotes a surface from which a substantial portion of surface contaminants or undesired native oxides have been removed by a conditioning gas, or on which a desired native oxide or other compounds has been formed by a conditioning gas.

In a still further aspect, the invention relates to a method of making a superconductor. The method includes growing an epitaxial superconductor layer on a surface of a material having a temperature that is about the same as a PVD epitaxial growth threshold temperature for a chamber pressure of about $1\times10^{-4}$ torr. The growing step is performed in a vacuum chamber having a pressure of at least about $1\times10^{-3}$ torr, and the material can be a buffer layer or a single crystal.

In one aspect, the invention features an article that includes an epitaxial buffer layer and a superconductor layer disposed on the buffer layer. The buffer layer has a pore density of less than about 500 pores per square millimeter.

As used herein, "pore density" refers to the number of pores at the surface of an epitaxial layer per unit area of the surface of the epitaxial layer.

In another aspect, the invention features an article that includes an epitaxial buffer layer and a superconductor layer disposed on the buffer layer. A surface of the buffer layer has inclusions with an average particle size diameter less than about 1.5 micrometers.

As used herein, "inclusions" refer to surface defects, such as second phase particles, that can act as locations of initiation of non-epitaxial growth at a surface.

The substrate material may be ceramaceous, such as an oxide, metallic, such as a metal or alloy, or intermetallic. It chemically comprises one or more substrate species, and at least one substrate species is different from the layer forming gas. In addition to the substrate species, the species present in the substrate surface may include native, oxides of one or more of the substrate species, and adsorbed surface contaminants.

Since the epitaxial layer typically includes a metal, the layer forming gas is usually a metal vapor. If the epitaxial layer includes more than one species, such as a metal oxide, the layer forming gas can comprise more than one gas. For example, if the epitaxial layer is formed of cerium oxide, the cerium vapor and oxygen can be used in the gas beam.

The conditioning of a substrate surface can occur by exposing the substrate surface to a background pressure of a conditioning gas. Alternatively, the conditioning of a substrate surface can occur by exposing the surface to a gas beam that includes a conditioning gas. Such gas beams can be directed gas beams or diffuse gas beams, and the conditioning gas included therein may have a high velocity or a low velocity. In some embodiments, conditioning of the substrate can occur by exposing the substrate surface to a background pressure of a conditioning gas and a conditioning gas that is included in the gas beam.

When using a background pressure of a conditioning gas to condition a substrate surface, the vacuum chamber typically has a partial pressure of the conditioning gas of at least about 0.5 percent, preferably from about 0.5 percent to about 10 percent, and more preferably from about 2 percent to about 6 percent. Thus, for example, if the vacuum pressure were about 100 millitorr, the partial pressure of hydrogen in the chamber can be at least about 0.5 millitorr.

In embodiments in which a conditioning gas is included in a gas beam, the conditioning gas may be introduced in the same stream as the layer forming gas or in a separate stream. In some embodiments, other species may also be introduced which are reactive either with the layer forming gas or with one or more additional species present in the substrate surface, but the stream containing the layer forming gas preferably contains only one other reactive species. Additional reactive species are preferably introduced in separate streams of substantially similar velocity. Large dissimilarities in stream velocities can favor one set of species reactions at the expense of the others, and are generally to be avoided. The desired epitaxial layer material may be the layer forming gas or the reaction product of the layer forming gas with one or more of the other species introduced into the low vacuum environment. The desired material may be ceramaceous, metallic, or intermetallic. Moreover, the desired material can be an oxide superconductor.

The substrate surface can be exposed to the conditioning gas and the layer forming gas in series or in parallel. For parallel processes, one portion of the substrate surface is conditioned while the epitaxial layer is grown on another portion of the substrate surface.

The chemical nature of the conditioning gas depends upon species present at the surface on which the epitaxial layer is grown. For example, if the surface has an undesired native oxide present at its surface, the conditioning gas can be a reducing gas, such as hydrogen. Alternatively, the conditioning gas can be an oxidizing gas, such as oxygen, if it is desirable to form a native oxide at the surface or if sulfur or carbon are contaminants present at the surface.

The velocities of the layer forming gas, conditioning gas and additional gaseous species dispersed in their streams should be positive., that is directed toward the substrate surface. In some embodiments, the velocities are greater than about 1 m/sec. Velocities as high as supersonic may be used. Velocities in the range of from about 10 m/sec to about 400 m/sec are preferred at typical low vacuum conditions. In a preferred embodiment, the velocity of the layer forming gas is originally high and is reduced from a high velocity to a low velocity prior to contact with the substrate surface, which in essence reduces its kinetic energy. The reduction in velocity is accomplished by interference from the low vacuum environment and also from a boundary layer of carrier gas which forms at the substrate surface. The decrease in the kinetic energy assists in thermal equilibration of the desired material with the substrate. While the high initial velocity of the gaseous species aids in the efficient transport of the layer forming gas to the substrate surface and thereby facilitates higher deposition rates, low velocity gases may also be effectively used in the scope of this invention. The term high velocity refers to positive velocities which approach at least about sonic levels, i.e the speed of sound at operating vacuum levels, such as 100–400 m/sec. The term low velocity refers to positive velocities of less than 10 m/sec and more generally less than 100 m/sec, but greater than 1 m/sec.

The term elevated temperature(s) refers to temperatures which are sufficient to allow diffusion of the desired material to low energy equilibrium sites after arrival at the substrate surface. The range of elevated temperatures will vary depending upon the materials involved and other specifics of the deposition process, such as vacuum level and deposition rate. Although this is a low vacuum process, the lower temperature limit is set as the threshold temperature for forming an epitaxial layer of the desired material on the substrate material in a high vacuum environment at the predetermined deposition rate. As used herein, the term low vacuum (or high pressure) refers to a vacuum pressure which is achievable using mechanical pumping systems or a pressure greater than or equal to about $1 \times 10^{-3}$ torr, and the term high vacuum (or low pressure) refers to pressure less than about $1 \times 10^{-5}$ torr of base vacuum. Temperatures found suitable for forming epitaxial layers in the invention correspond to temperatures that are suitable for forming epitaxial layers with pressures that are from about $10^3$ to $10^6$ lower, and preferably from about $10^3$ to $10^4$ lower, than pressures used with methods that involve diffuse gas beams. Thus, for example if a pressure of about $1 \times 10^{-1}$ torr is used in the invention to form an epitaxial layer of a desired material on a given substrate material at a particular growth rate, the substrate temperature can be the same as would be used at a pressure of from $1 \times 10^{-1}$ to $1 \times 10^{-7}$ torr to grow the same epitaxial layer under the same conditions with a diffuse gas beam. An upper end of the elevated temperature range is set as 90% of the melting point of the selected substrate material. Typically the substrate surface is heated to a temperature which is less than the prior art threshold temperature for forming an epitaxial layer of the desired material on the substrate material in the low vacuum environment at the predetermined deposition rate.

In some embodiments, an additional conditioning gas which can be reactive with the layer forming gas is provided.

In other embodiments, the conditioning gas is reactive with the layer forming gas as well as one or more species present at the substrate surface. In embodiments in which the substrate material is metallic and the epitaxial layer is an oxide of the layer forming gas, the conditioning gas may be chosen to be more oxidizing with respect to the layer forming gas than with respect to a native oxide of the substrate material. In embodiments in which the substrate and epitaxial layer are both metallic, the conditioning gas may be reducing with respect to both. In some embodiments, a layer forming gas can also serve as a conditioning gas. For example, oxygen can be used to remove impurities and/or an oxide of the substrate surface as well as form an oxide epitaxial layer.

When a substrate of preferred crystallographic orientation is used, such as a cubic textured substrate, deposition of an epitaxial layer onto the substrate according to the process of this invention provides a composite material which is suitable for preparing a superconductor composite. The cubic texture of the substrate is transferred to the epitaxial layer which, in turn may transfer this orientation to a superconducting oxide layer. The superconducting oxide layer may be deposited onto the substrate and epitaxial layer using the process of this invention.

The invention allows the application of high vacuum-like evaporation processes to the fabrication of large scale substrate areas without limitations which are typically imposed by a high vacuum system. Material usage efficiencies are typically increased from less than 50 percent to over 95 percent by the directed layer-forming deposition streams. Furthermore, the directed layer-forming stream in the low vacuum environment reduces the uncertainty associated with the formation of epitaxial films on metallic substrates. The deposition stream can produce a surface boundary layer which enhances the nucleation and growth of epitaxial films on the substrate surface and reduces the temperatures required for epitaxial film growth. The addition of at least one conditioning gas, as allowed by the low vacuum operation, can be used to disrupt a native surface oxide on substrate materials which allows the template of the crystallographically oriented substrate, preferably a cubic textured alloy, to be directly available for the depositing atoms of the preselected material. The layer forming gas and the conditioning gas can be selected to thermodynamically favor specific compounds and materials to improve epitaxial film growth. A consistent process is developed as well, which can eliminate the system to system variation in the deposition of epitaxial films in high vacuum systems. The high energy, low vacuum approach of the present invention also provides the opportunity to use a single manufacturing method for both the buffer layer and the superconducting film layer of a composite article without high vacuum processing.

For epitaxial layers, it is generally disadvantageous to have a high pore density or inclusions with a large average particle size. The invention can provide epitaxial layers having low pore densities and/or inclusions with small particle sizes. The epitaxial layers preferably have a pore density of less than about 500 pores per square millimeter, more preferably less than about 250 pores per square millimeter, and most preferably less than about 130 pores per square millimeter. The epitaxial layers preferably have inclusions with an average particle size of less than about 1.5 micrometers, more preferably less than about 1 micrometer, and most preferably less than about 0.5 micrometers.

In embodiments in which a conditioning gas is included in a gas beam, the gas beam which impinges upon the substrate surface should include a sufficient amount of conditioning gas to condition the substrate surface and allow the epitaxial layer to grow. Preferably, the gas beam that impinges upon the substrate surface includes from about 0.5 molar percent to about 10 molar percent conditioning gas, more preferably from about 1 molar percent to about 8 molar percent conditioning gas, and most preferably form about 2 molar percent to about 6 molar percent conditioning gas.

In some embodiments, it can be advantageous to form the epitaxial layer at a fast rate. In these embodiments, the epitaxial layer is preferably grown at a rate of at least about 50 Angstroms per second, more preferably at least about 100 Angstroms per second, and most preferably at least about 150 Angstroms per second. These growth rates can be achieved at a vacuum chamber pressure of at least about $1\times10^{-3}$ torr.

The epitaxial layers can be formed without using electron beams or ion beams.

DESCRIPTION OF THE PREFERRED EMBODIMENTS

Figure 1:
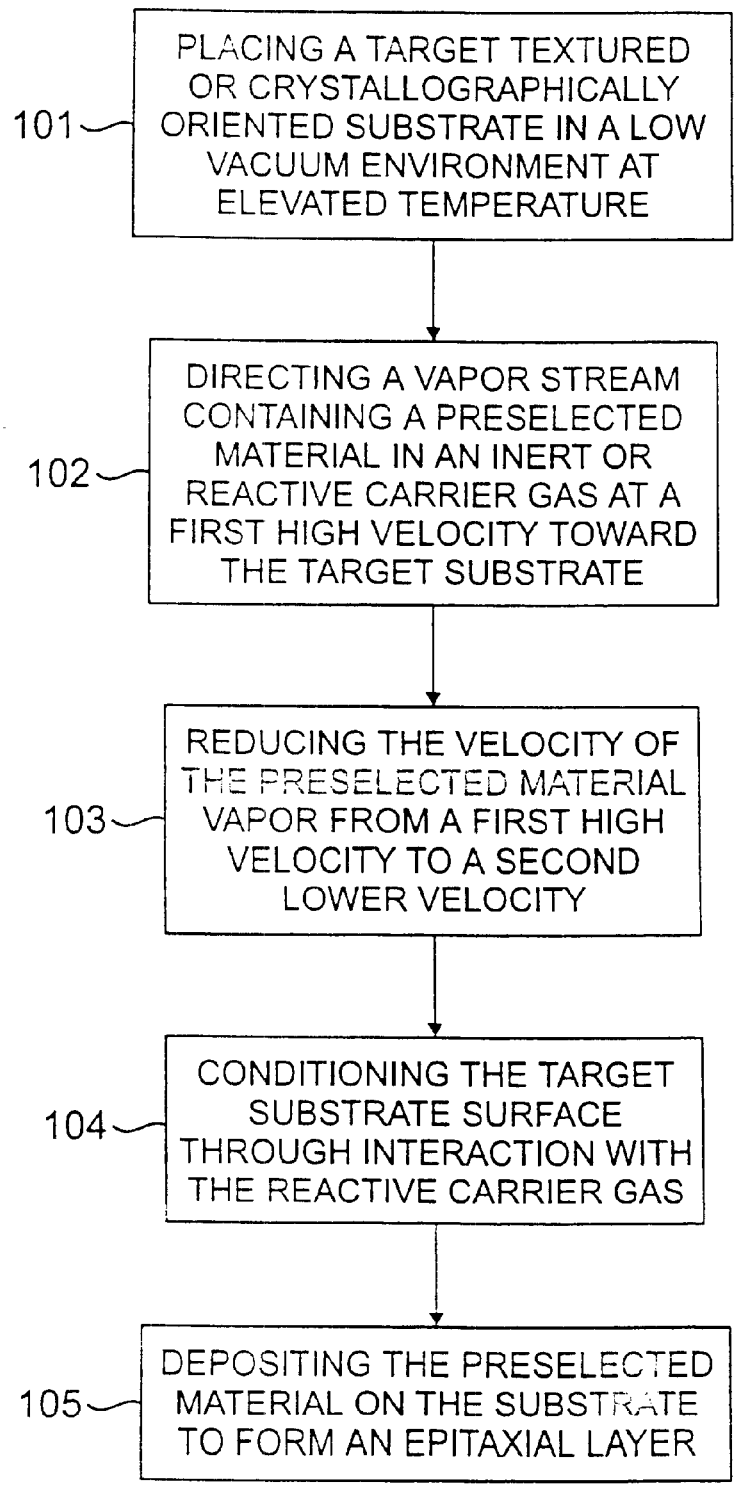
FIG. 1 outlines the low vacuum vapor process to produce epitaxial layers.

The invention provides a method of fabricating a superconductor article which has an epitaxial layer. A preferred embodiment of the method is outlined in FIG. 1 and includes placing a textured substrate surface in a low vacuum environment 101, and heating the substrate surface to an elevated temperature via a heat source. In addition to the substrate species, the species present in the substrate surface typically include certain contaminant materials such as undesired native oxides of one or more of the substrate species and adsorbed surface contaminants. In some embodiments, desired native oxides of one or more of the substrate species may be present. A stream including a layer forming gas, a conditioning gas and an inert carrier gas is directed at high velocity toward the substrate surface through the low vacuum environment 102. Alternatively, step 102 is performed by providing a background pressure of the conditioning gas and a stream including a layer forming gas and a carrier gas is directed at the substrate surface. The conditioning gas reacts with one or more of the species present in the substrate surface to condition the substrate surface and promote nucleation of the epitaxial layer 104. In the preferred embodiment illustrated, the velocity of the layer forming gas is reduced from high velocity to low velocity 103 by interference with the substrate, a gaseous boundary layer adjacent the substrate surface and the low vacuum environment. The layer forming gas, or in some embodiments, its reaction product with the conditioning gas, is deposited onto the substrate at an elevated temperature to form an epitaxial layer 105. Oxide superconductors are deposited onto the epitaxial layer to form a superconducting composite article.

The substrate surface is heated to an elevated temperature which is less than about 90% of the melting point of the substrate material but greater than the threshold temperature for forming an epitaxial layer of the desired material on the substrate material in a high vacuum environment at the predetermined deposition rate. Typically the substrate surface is heated to a temperature which is less than the prior art threshold temperature for forming an epitaxial layer of the desired material on the substrate material in the low vacuum environment at the predetermined deposition rate. Temperatures suitable for forming epitaxial layers in vacuums from about $10^3$ to $10^6$ lower, and preferably from about $10^3$ to $10^4$ lower, than the actual vacuum conditions may be used. Epitaxial metal layers have successfully been produced at temperatures of 77° K and below. Typical lower limit temperatures for the growth of oxide layers on metal are approximately 200 degrees Celsius. The growth of epitaxial oxide films on oxide substrates can occur at lower temperatures. In some embodiments, the substrate surface has a temperature of from 200° C. to 800° C., preferably 500° C. to 800° C., and more preferably from 650° C. to 800° C. Various well-known methods such as convection heating and conduction heating may be used to obtain the desired temperature elevation.

Figure 2:
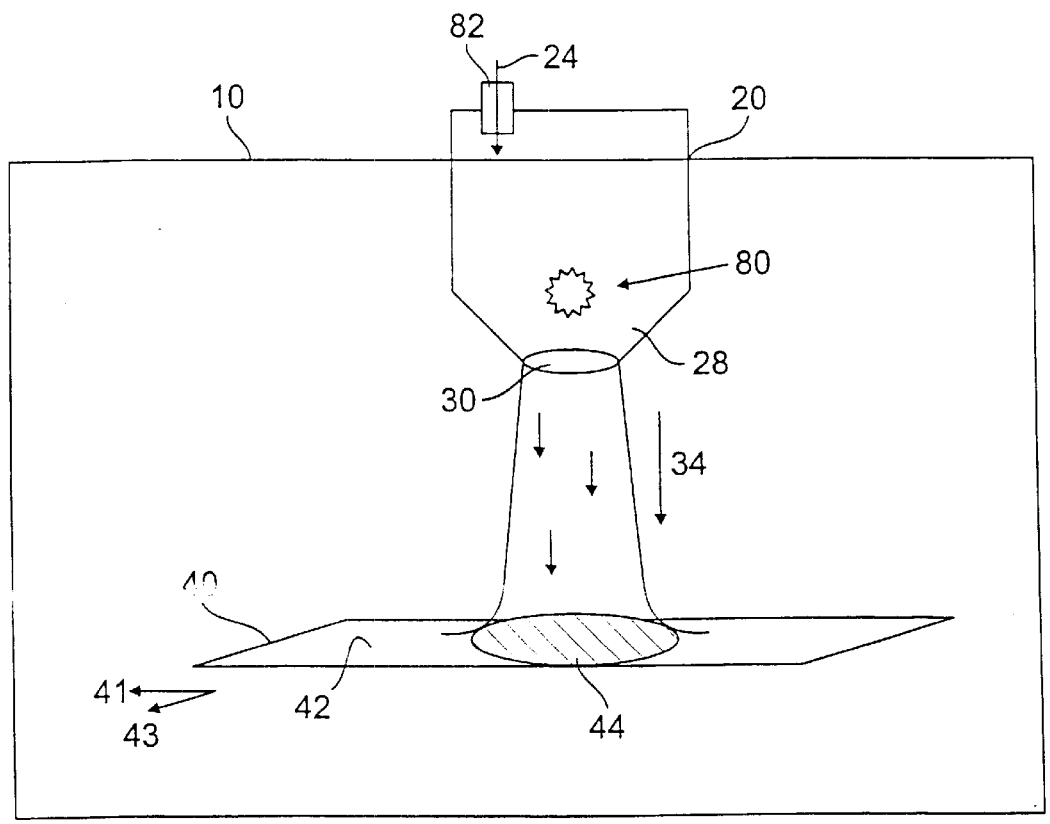
FIG. 2 illustrates an embodiment of an apparatus that can be used with the method of the invention.
Figure 3:
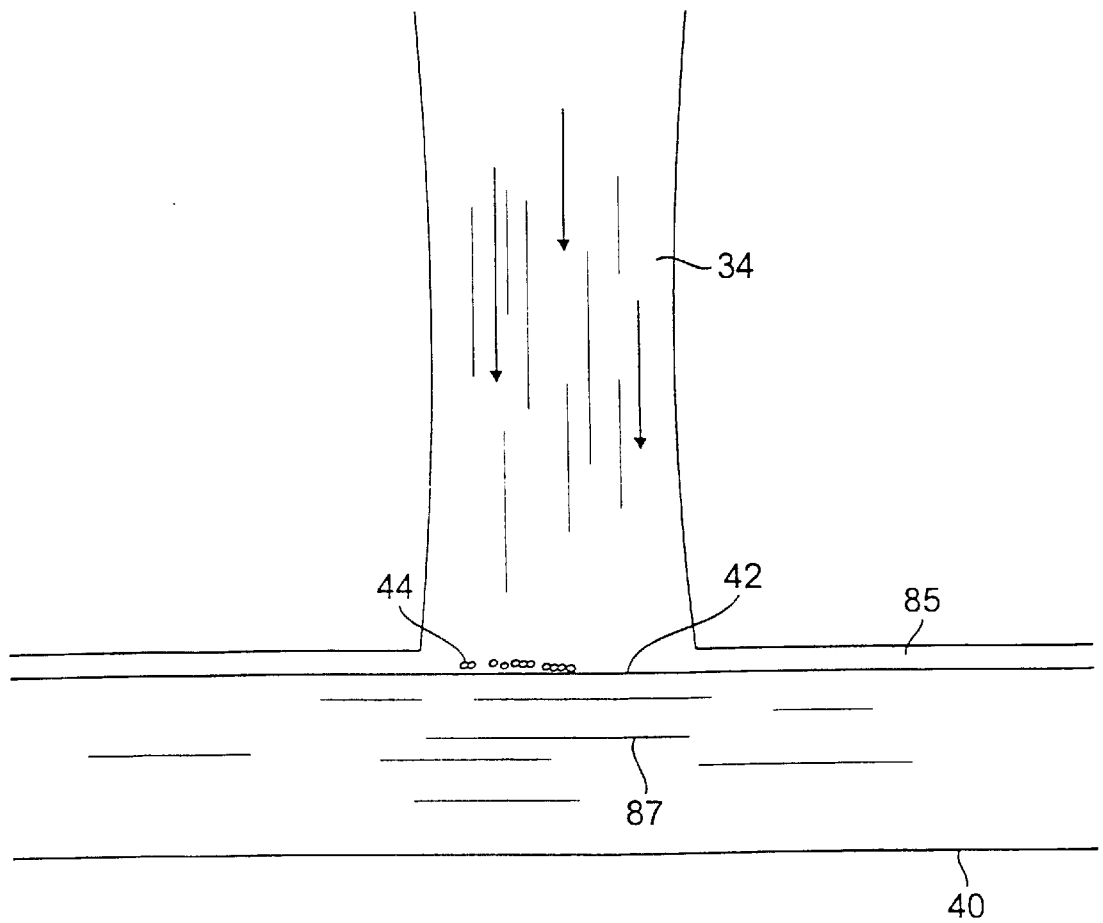
FIG. 3 illustrates a boundary layer formed on a substrate.
Figure 4:
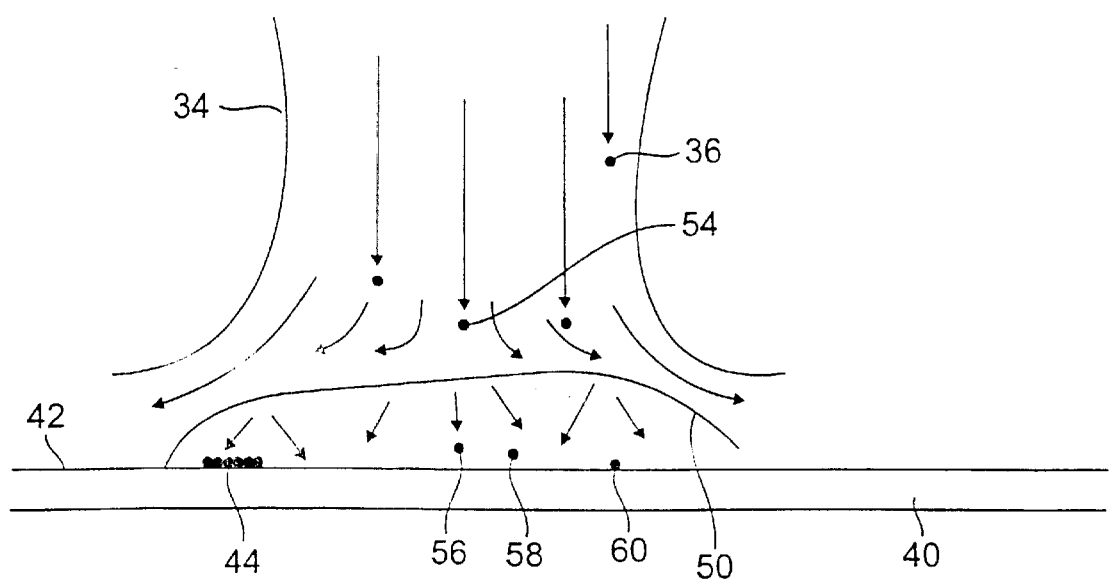
FIG. 4 is a close-up view of a portion of FIG. 3 illustrating the motion of individual atoms in the boundary layer.

Referring to FIGS. 2–4, there is shown a directed vapor deposition machine for use, for example, with the low vacuum process of the present invention. Other apparatus for forming and directing a vapor stream may also be used. The machine 10 includes an evaporation housing 20 for a high pressure environment which includes a vapor source 21 for a layer forming gas 22 and a source 23 for a conditioning gas 46 and inert carrier gas 26 to form a dispersion which is ejected from the housing 20 by a nozzle 28 through a nozzle opening 30 at high velocity and energy. If the conditioning gas is provided in machine 10 at a background pressure, machine 10 can include a leak valve for entering the conditioning gas into machine 10. Such leak valves are well known to those skilled in the art.

The dispersion forms a high speed stream 34 of the carrier gas 26, layer forming gas 22 and conditioning gas 46. This stream is usually a directed gas beam. The stream 34 is directed by the source 28 at near sonic velocity, such as 100–400 m/sec, through a low vacuum environment 32 toward the substrate surface 42 of a work piece or substrate 40. The velocity of the layer forming gas 22 is reduced from the high energy and high velocity of the stream to low energy and velocity as the individual atoms 36 of the layer forming gas 22 are deposited onto the surface 42 of the substrate 40. This is accomplished through the collision of the atoms or molecules of the layer forming gas with the gas molecules in a gaseous boundary layer which is created by the impingement of the carrier gas 26 as the carrier gas 26 strikes the substrate surface 42. The result is that the individual atoms or molecules 36 contact the substrate 40 at low kinetic energy and low velocity, thereby settling into a desirable and stable low energy configuration for epitaxial layer nucleation and growth. This forms the deposited layer 44 on substrate 40.

The directed flow of gas from nozzle opening 30 can result in high material usage efficiencies. Preferably, at least about 75% of the layer forming gas that emanates from nozzle opening 30 is incident at the substrate surface, more preferably at least about 90%, and most preferably at least about 95%.

With the present system, one or more substrates 40 can either be held stationary, or moved under computer control in an X-Y coordinate system as shown by arrows 41 and 43 in FIG. 2. Movement of the substrate facilitates the use of multiple directed streams, as further illustrated and discussed in connection with FIGS. 5A and 5B. It can also be seen from FIGS. 2, 5A and 5B that a wide variety of materials may be deposited to form different end products, such as metals, alloys, multilayers, composites, nitrides, oxides, or any other vapor depositable material.

Figure 5A:
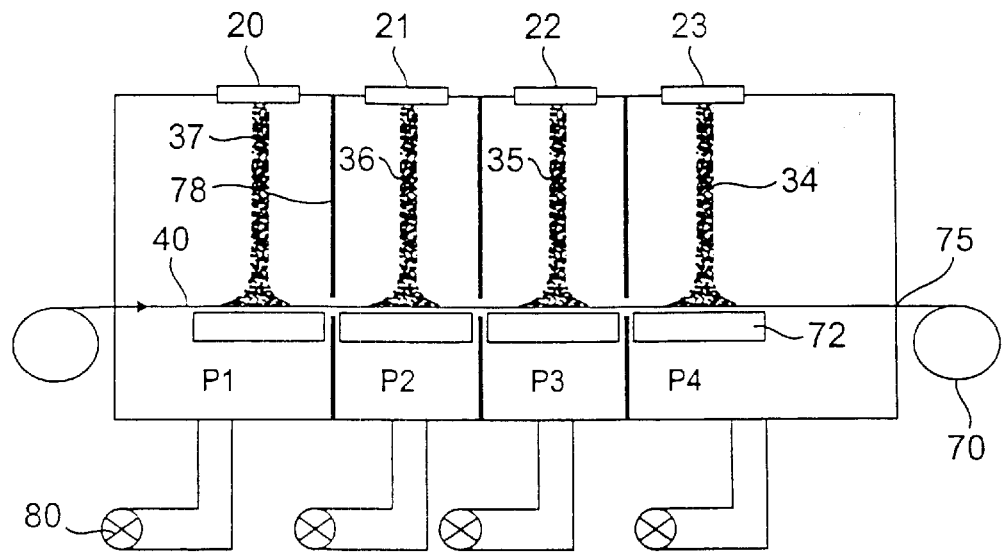
FIGS. 5A and 5B illustrate multistream vapor deposition processes in accordance with the invention.

With the present system, a substrate of unlimited length and finite width may be transported across the field of deposition of the directed vapor stream 34 as shown in FIG. 5A. A substrate 40 in the form of a long tape may be mounted on reels external to the deposition chamber and passed in to and out of the low vacuum environment through conventional gas seals 75. As the substrate passes through the deposition chamber the substrate temperature is raised to the deposition temperature by the heaters 72. A directed vapor stream 34 impinges on the moving substrate both controlling the substrate surface condition and depositing the layer forming gas epitaxially upon the substrate surface.

Figure 5B:
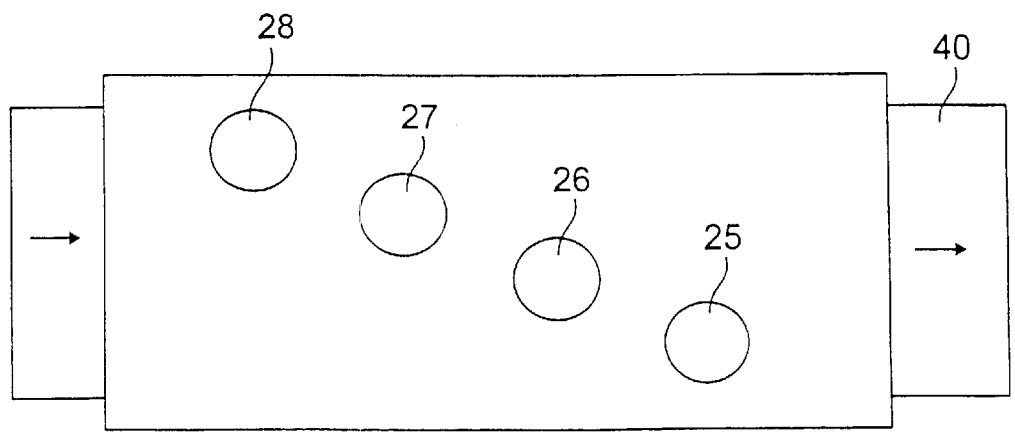

As the substrate traverses the deposition chamber, additional directed vapor streams 35, 36, 37 can be used to either condition the substrate surface or deposit one or more epitaxial species on the substrate surface. Multiple nozzles 20, 21, 22, 23 can be employed in-line on an axis coincident with the substrate transport direction to increase the amount of material which can be deposited in a given deposition chamber as shown in FIG. 5A. Alternatively, as shown in FIG. 5B, the nozzles 25, 26, 27, 28 may be offset from the transport axis to allow broader coverage of a wide strip as the substrate moves through the deposition chamber. Many alternative advantageous arrangements of the multiple deposition sources are readily apparent.

With the addition of the baffles 78 each source may produce a different vapor composition with different reactive species and/or different functions. For example, a first stream 37 may be used to cleanse the substrate of contaminants and native oxide scale. A second stream 36 may be used to deposit a first epitaxial layer. A third stream 35 may be used to deposit a second epitaxial layer. A fourth stream 34 may be used to deposit a superconducting oxide precursor or layer. Further epitaxial layers can be added by additional gas beams. The low vacuum environment allows these multiple depositions to be accomplished with simple baffles, or gas seals between subchambers. If dissimilar directed vapor streams are used, it is preferable to maintain the subchamber pressures such that the initial vapors are not contaminated by later vapors, i.e. the pressure in each subsequent chamber must be slightly lower than in prior chambers and all chamber pressures must be less than the source pressures. This can be accomplished by simple valving to differentially pump the subchambers.

The vapor deposition system of the present invention 10 employs an evaporation source 20 which can operate under low inert gas pressure of approximately 2–5 torr. Conventional deposition sources, such as sputtering, thermal, chemical or other sources such as those commercially available from Jet Process Corporation of New Haven, Conn., are used to produce the vapor. Such sources are disclosed in, for example, U.S. Pat. Nos. 5,265,205; 5,356,672; 5,356,673; and 5,571,332, each of which is hereby incorporated by reference.

The layer forming gas can be any material, with metallic and oxide sources preferred. Multiple evaporation sources and alloys may be used concurrently in a single stream for deposition of complex materials or sequentially in several streams for layered schemes. The layer forming gas should meet certain requirements, such as lattice match with the superconducting oxide and the substrate material, chemical compatibility with the substrate and the superconducting oxide, and appropriate thermo-physical and electrical properties depending upon various applications. Without intending any limitation, materials which may be used as epitaxial or buffer layers for a superconductor include $CeO_2$, yttria-stabilized zirconia, $LaAlO_3$, $SrTiO_3$, $LaNiO_3$, $LaCuO_3$, $SrRuO_3$, $CaRuO_3$, $NdGaO_3$, $NdAlO_3$.

The layer forming gas mixes with an inert carrier gas 26 which enters the evaporation source 20 through opening 24. The carrier gas can be chosen and tailored to the requirements of the system, thereby allowing greater freedom of choice for the vapor sources. A conditioning gas, such as a reducing gas, can be added to the carrier gas 26. Alternatively, a background pressure of a conditioning gas can be established in the vacuum chamber. Conditioning gases suitable for use with the present invention include, but are not limited to, oxygen, argon, helium, hydrogen, nitrogen, halogen-containing compounds and mixtures thereof.

In embodiments in which the conditioning gas is included in a gas beam, a preferred combination of carrier gas and conditioning gas is argon with approximately 4 to 10 % hydrogen. In some embodiments, the hydrogen can be added downstream of the source 28 via a separate source. Alternatively, a conditioning gas such as the hydrogen can be supplied in a separate cleansing stream which contacts the substrate material before the substrate material is contacted by the layer-forming stream containing carrier gas 26 and the layer forming gas. The concentration of the hydrogen is varied according to the specific materials selected for the epitaxial buffer layer 44 and according to the substrate material.

In embodiments in which a background pressure of a conditioning gas is used, the hydrogen should comprise at least about 0.5 percent of the pressure of the chamber. Preferably, the hydrogen comprises from about 0.5 percent to about 10 percent of the pressure of the chamber, more preferably from about 1 percent to about 8 percent, and most preferably from about 2 percent to about 6 percent.

The addition of a conditioning gas such as hydrogen or oxygen, either to the carrier gas 26 or via a separate stream creates a reactive background for the layer forming gas which stimulates the nucleation of an epitaxial layer on the surface 42 of the substrate 40. As noted above, this reactive background can be established, at least in part, by establishing a background pressure of a conditioning gas. In one preferred embodiment, a conditioning gas may be supplied in the layer-forming stream with the layer forming gas, or subsequently in a separate stream, to promote formation of an interlayer for the desired material. In a preferred embodiment, the conditioning gas is leaked into the chamber using a leak valve. For the case of a substrate where an epitaxial native oxide scale is preferred as an interlayer for the epitaxial layer, the conditioning gas may be oxygen, and an oxygen partial pressure can be selected to form a desired oxide from elements within the substrate alloy. For example, oxygen partial pressure on the order of $1 \times 10^{-5}$ torr in the low vacuum carrier gas may be selected to form a stable epitaxial alumina or chromia scale on nickel base alloys while avoiding the formation of nickel oxide.

In another preferred embodiment, a background partial pressure of a conditioning gas reacts with a surface contamination of adsorbed elements, such as carbon or sulfur, forming a second gas phase which is carried away from the substrate surface in the flowing gas stream. This effect is emphasized in the presence of a native oxide scale on a metallic substrate surface. Native oxide scales can form in amorphous fashion, as random crystallographic scales or as epitaxial scales. The epitaxial scales often form in a different crystallographic orientation from the substrate due to changes in crystal lattice parameter as the oxide is formed. These oxide scales can interfere with the nucleation of epitaxially deposited oxide films from the desired metallic template. Adsorbed contaminants are cleaned from the surface of metallic substrates by forming a native oxide scale and then subsequently removing that scale by reduction in high temperature in an atmosphere of argon gas with a partial pressure of hydrogen. The present invention allows for this cleansing process to take place in situ with the desired epitaxial film deposition process. This invention also allows for precise control over the presence, controlled growth or removal of native oxide films by adjustment of background reactive gas composition in situ with the deposition process. In some embodiments, an additional conditioning gas which can react with the layer forming gas may be supplied in the layer-forming stream with the layer forming gas, or subsequently in a separate stream, to promote formation of the desired material. In a preferred embodiment, multiple separate directed vapor streams containing a series of conditioning gases and layer forming gases can be employed to sequentially cleanse contaminants and native oxide films from the substrate surface and to deposit the desired epitaxial oxide layer without removal from a high vacuum chamber or changes in source material.

The carrier gas 26 and the layer forming gas form a dispersion which is accelerated by the nozzle 28 to a positive velocity, which is greater than 1 m/sec and may be in the range of several hundred meters per second. The nozzle 28 imparts a given velocity and kinetic energy to the atoms or molecules 36 of the layer forming gas and the gas 26. This dispersion forms a directed vapor stream 34 which is directed through the low vacuum environment 32 and toward the substrate 40. The kinetic energy of a given individual atom or molecule 36 is dependent upon the type of material and the initial velocity produced by the source 28.

The low vacuum environment within the substrate deposition chamber is preferably maintained at a pressure of at least about $1 \times 10^{-3}$ torr, usually from about $1 \times 10^{-3}$ torr to about 2 torr, but typically at less than 50 percent of the source chamber pressure in order to ensure adequate vapor stream acceleration to the substrate. It has been discovered that a low vacuum process of the present invention provides improved results over conventional high vacuum processes. In conventional physical vapor deposition, increases in deposition chamber pressure result in more collisions of the layer forming gas with gas molecules, thereby reducing the mean free path of flight of the atoms or molecules of the layer forming gas, and dispersing the vapor. The present invention takes advantage of this otherwise detrimental effect to slow the individual atoms or molecules 36 of the layer forming gas to a lower velocity just above or at the substrate surface, and hence lower the kinetic energy level. This allows the interfacial mobility of the depositing atoms or molecules to be high, allowing them to settle into a stable low energy configuration upon deposition onto the lo substrate 40. This avoids random implantation of individual atoms 36 of the dispersion onto the substrate 40 at high velocity and high energy. The driving force for epitaxial nuclei to form is thus increased, while providing a uniform, high rate-deposited layer 44 on the substrate surface 42 at is lower temperatures than could otherwise be utilized.

Substrates for use in the process of the present invention 10 are preferably cubic textured alloys or metals. However, single crystal oxide substrates and single crystal metal and alloy substrates have been used successfully. Those skilled in the art will recognize many such substrates which can be advantageously used under the scope of the present invention. A preferred substrate for use in a superconductor composite is a nonmagnetic nickel alloy with a cube texture. Additionally, other face centered cubic metals and alloys can be preferably employed as substrate materials under the present invention. The use of the invention allows the deposition of epitaxial oxide buffer layers on copper or copper-based alloys, such as copper-nickel without deleterious oxidation of the metal or alloy substrate. More generally, any crystallographically oriented or textured substrate may be used, provided conditions suitable for epitaxy such as lattice match and chemical compatibility may be arrived at.

Examples of nickel-copper alloys are disclosed in commonly assigned U.S. patent application Ser. No. 08/943,047, entitled "Substrates with Improved Oxidation Resistance", filed Oct. 1, 1997, which is hereby incorporated by reference.

As shown by FIG. 3, the deposition and growth of epitaxial layers are enhanced by the removal of native oxide and surface contaminant 85 on the substrate surface 42. The conditioning gas in the high energy deposition stream 34 disrupt the native oxide 37 on the surface 42 of the substrate 40. This exposes the crystallographically oriented substrate template 87 while removing species 85 and allows direct deposit of the layer forming gas onto the substrate surface 42 to form an epitaxial layer 44. In this manner, the crystallographic orientation of the substrate is transferred to the epitaxial layer. This crystallographic orientation is then, likewise transferred to a superconducting oxide when a superconducting composite is formed.

Referring to FIG. 4, the deposition of the layer forming gas onto the surface 42 of the substrate 40 can be described in greater detail. As the stream 34 is directed at the substrate surface 42, the carrier gas forms a boundary layer 50 on the substrate 40. The boundary layer 50 is created by the carrier gas striking the surface of the substrate 40 at positive velocity and bouncing back upward toward the source 28. However, since the stream 34 continues to flow downward towards the substrate 40 at a positive velocity, the reflected carrier gas is forced downward again to the substrate, thereby forming a continuous oscillation and boundary layer above the substrate surface 42. The greater the velocity of the initial stream, the more significant the boundary layer effect. The boundary layer 50 assists in creating interference to change the velocity and hence, kinetic energy of individual atoms or molecules 36 of the layer forming gas from the higher energy and higher velocity to a significantly lower velocity and kinetic energy prior to deposition of the individual atom or molecule 36 onto the substrate surface 42. Thus, regardless of the initial speed of the stream, within the limits disclosed, the velocity and kinetic energy of the atoms or molecules 36 will be low at the substrate surface. To further illustrate this point, reference is made to individual atoms 54, 56, 58 and 60 of FIG. 4. Individual atom 54 is directed at the substrate 40 at near-sonic velocity and high kinetic energy by source 28 and strikes the boundary layer 50 above the substrate 40. The boundary layer 50 causes interference with the individual atoms, such as atom 56, which is slowed and reduced from relatively high energy and velocity to a much lower velocity relative to the substrate normal. An atom which has been slowed and interfered with by the boundary layer 50, such as atom 58, is then free to float or settle into a stable low energy configuration on the substrate surface 42. Once an atom is deposited on the substrate 40, such as atom 60, the elevated temperature of the substrate 40 allows interface mobility of the atom 60. This allows atom 60 to move on the surface 42 to a stable position, in contrast to other high energy deposition processes which embed atoms into a substrate surface. As several atoms are deposited on the surface and position themselves at desired low energy configurations, an epitaxial layer 44 is grown. Epitaxial layer 44 can reach thicknesses of 0.01 to 5 micrometers with the process of the present invention 10. Further, the temperature of the substrate 40 should be maintained at 25° C. to 800° C. for deposition and interface mobility.

This is a significant improvement over other deposition processes, such as sputtering, which do not have the necessary low substrate arrival energy for individual atoms of the layer forming gas. A high arrival energy causes the atoms 36 to shoot off randomly in a static environment without the carrier gas creating a boundary layer. By the process of the present invention, material usage efficiencies can be increased from less than 50 percent to over 95 percent as materials are deposited without scattering. Materials are also not embedded into substrate surfaces with the present invention, thereby allowing a stable and uniform epitaxial layer to grow.

Figure 6:
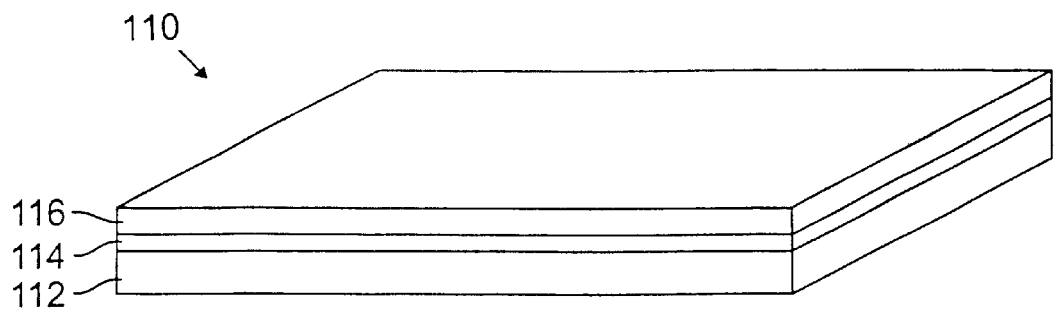
FIG. 6 illustrates a superconductor article fabricated by a low vacuum vapor deposition process.

Referring now to FIG. 6, there is shown a superconducting composite article formed according to the processes of the present invention. The superconducting composite 110 includes the substrate 112, an epitaxial buffer layer 114 deposited on the substrate 112 and a superconducting oxide layer 116 deposited on the epitaxial layer 114. Epitaxial buffer layers 114 can be deposited on the substrate 112 primarily to provide a suitable template for growth of the high temperature superconductor film 116 and to provide a barrier to diffusion of substrate elements into the high temperature superconductor film 116. To be effective, the buffer layer should be uniform, continuous and smooth. These features can be achieved with the process of the present invention. A defined epitaxial relationship with the substrate 112 gives control of the crystallographic template for high temperature superconductor film nucleation and growth. Epitaxial buffer layers suitable for use with the superconductor produced according to the process of the present invention may include any of the materials listed previously and are preferably deposited in thicknesses of 0.01 micrometers to 0.5 micrometers. Orientation relationships between these buffer layer materials and a given substrate material can be determined individually.

The superconducting oxide layer 116 is preferably a rare earth superconducting oxide, with $YBa_2Cu_3O_x$ (YBCO) being preferred. Partial or complete substitution for yttrium, if desired, of neodymium, samarium, europium, gadolium, terbium, dysoberium, holmium, erbium, thulium, ytterbium, or lutetium can be made. Mercury and thallium based high temperature superconductor films may also be used. The YBCO films are deposited on the textured substrate through a variety of methods, such as pulsed laser deposition, chemical vapor deposition, electron beam evaporation, metallorganic or sol-gel solution precursor methods, as well as the process of the present invention can be utilized.

A preferred precursor approach uses a metallorganic triflouroacetate precursor solution. With this method, high temperature superconductor films are spun or dip or web coated and then reacted to form the superconducting YBCO phase. The as-coated precursor includes an oxyflouride film containing BaF2. Heat treatment in a controlled atmosphere, such as that disclosed in U.S. Pat. No. 5,231,074 issued to Cima et al. fully incorporated herein by reference, decomposes the $BaF_2$ phase and thereby crystallizes the film. This allows the nucleation and growth of an epitaxial YBCO film. Alternatively, the precursor may be deposited by e-beam evaporation or other evaporation or spray processes and subjected to the same controlled reaction process. YBCO film thicknesses of approximately 1 micrometer to 10 micrometers are preferred, and more preferably 2 micrometers to 5 micrometers. The superconductor composite 110 preferably has a critical current density of 1 $MA/cm^2$ to approximately 3 $MA/cm^2$.

In alternate embodiments, superconductor oxides can be formed using the gas phase methods of the invention. In addition, the gas phase methods of the invention can be used to grow an epitaxial layer of a superconductor directly onto the surface of a metal single crystal.

An epitaxial layer formed by the gas phase methods of the invention can have a defect density that is at least about ten times less than the defect density of epitaxial layers formed by known PVD, CVD and sputtering techniques. Moreover, epitaxial layers formed by the gas phase techniques of the invention can have porosities that are from about four to about five times less than the porosity of epitaxial layers formed by known PVD, CVD and sputtering methods.

Pores present at the surface of an epitaxial layer represent one type of imperfection in the epitaxial layer. Thus, it is desirable to provide epitaxial layers having a low pore density. Preferably, the epitaxial layers have a , pore density of less than about 500 pores per square millimeter, more preferably less than about 250 pores per square millimeter, and most preferably less than about 130 pores per square millimeter.

Inclusions present at the surface of an epitaxial layer can initiate non-epitaxial growth, so it is advantageous to reduce the size of these inclusions. Preferably, the epitaxial layers have inclusions with an average particle size diameter of less than about 1.5 micrometers, more preferably less than about 1 micrometer, and most preferably less than about 0.5 micrometers.

Figure 7:
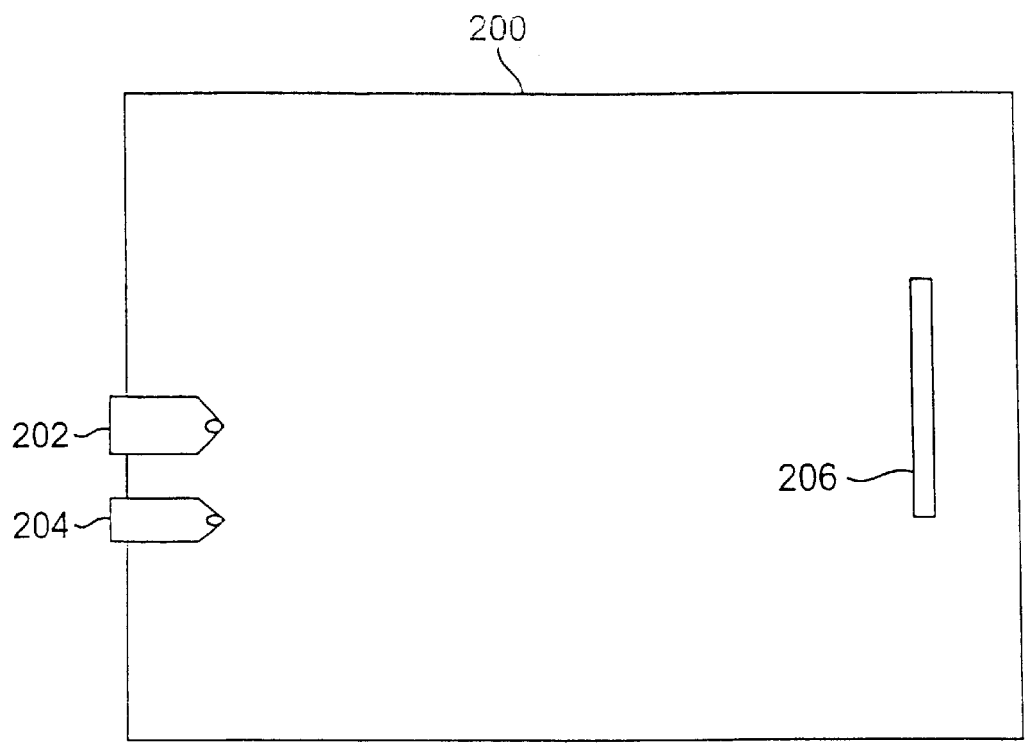
FIG. 7 illustrates another embodiment of an apparatus that can be used with the method of the invention.

While the above discussion has focused on embodiments in which multiple nozzles are used in series, in some embodiments, more than one nozzle can be used in parallel. FIG. 7 illustrates such an embodiment in which vacuum apparatus 200 includes beam sources 202 and 204 and surface 206 which can be similar to the corresponding components discussed above. The layer forming gas can emanate from one beam source, and the conditioning gas can emanate from the other beam source. The substrate surface can be exposed to the conditioning gas and the layer forming gas in series or in parallel, as described above.

EXAMPLE I

The effect of substrate temperature on epitaxial layer growth was studied for epitaxial layers of cerium oxide formed on a single crystal lanthanum aluminate substrate.

Cerium was sputtered from a metallic cerium target to form cerium vapor. The cerium vapor was entrained in a mixture of argon/10% oxygen gas which was directed toward the substrate at high velocity through a nozzle. Thus, the carrier gas, layer forming gas and conditioning gas were argon, cerium vapor and oxygen, respectively. In this example, the conditioning gas reacted with the layer forming gas to provide the cerium oxide layer.

The substrate was a polished $LaAlO_3$ single crystal chip with the {001} sheet normal face exposed to the deposition stream. The linear deposition rate was approximately 12 nm/min. The substrate temperature during deposition was varied between 200° C. to 450° C. The deposition chamber pressure was maintained at about 120 millitorr.

A substrate temperature of less than about 350° C. resulted in $CeO_2$ layers of relatively poor quality; in one case a {111} sheet normal texture with random in-plane texture, in a second case a {001} sheet normal texture with an in plane texture of approximately 15 degrees full width half maximum on a {111} peak.

A substrate temperature of at least about 400° C. showed excellent epitaxial relationship with the $LaAlO_3$ substrate, with full widths at half maximum ranging from 5 degrees to 7.7 degrees.

Separate experiments on deposition of $CeO^2$ on $LaAlO^3$ to were conducted in an electron-beam chamber. $CeO_2$ could not be deposited epitaxially from a metallic source but could be deposited epitaxially from an oxide source.

The use of a metallic source was made possible in the low vacuum approach by the ability to add a layer forming gas, oxygen, to the carrier gas stream. Evaporation rates are generally higher from metallic sources, increasing the viability of the low vacuum process for an economical manufacturing capability.

EXAMPLE II

The effect of using removing a native oxide from the substrate surface was studied.

Cerium vapor was formed as in Example I. The substrate was a polished single crystal nickel disk oriented with the {001} sheet normal. The vapor was entrained in a gas mixture of argon or argon plus 5–10% oxygen.

The substrate temperature was raised in a series of experiments from the 400° C. to 540° C. Epitaxial layers were grown in each case.

Figure 8:
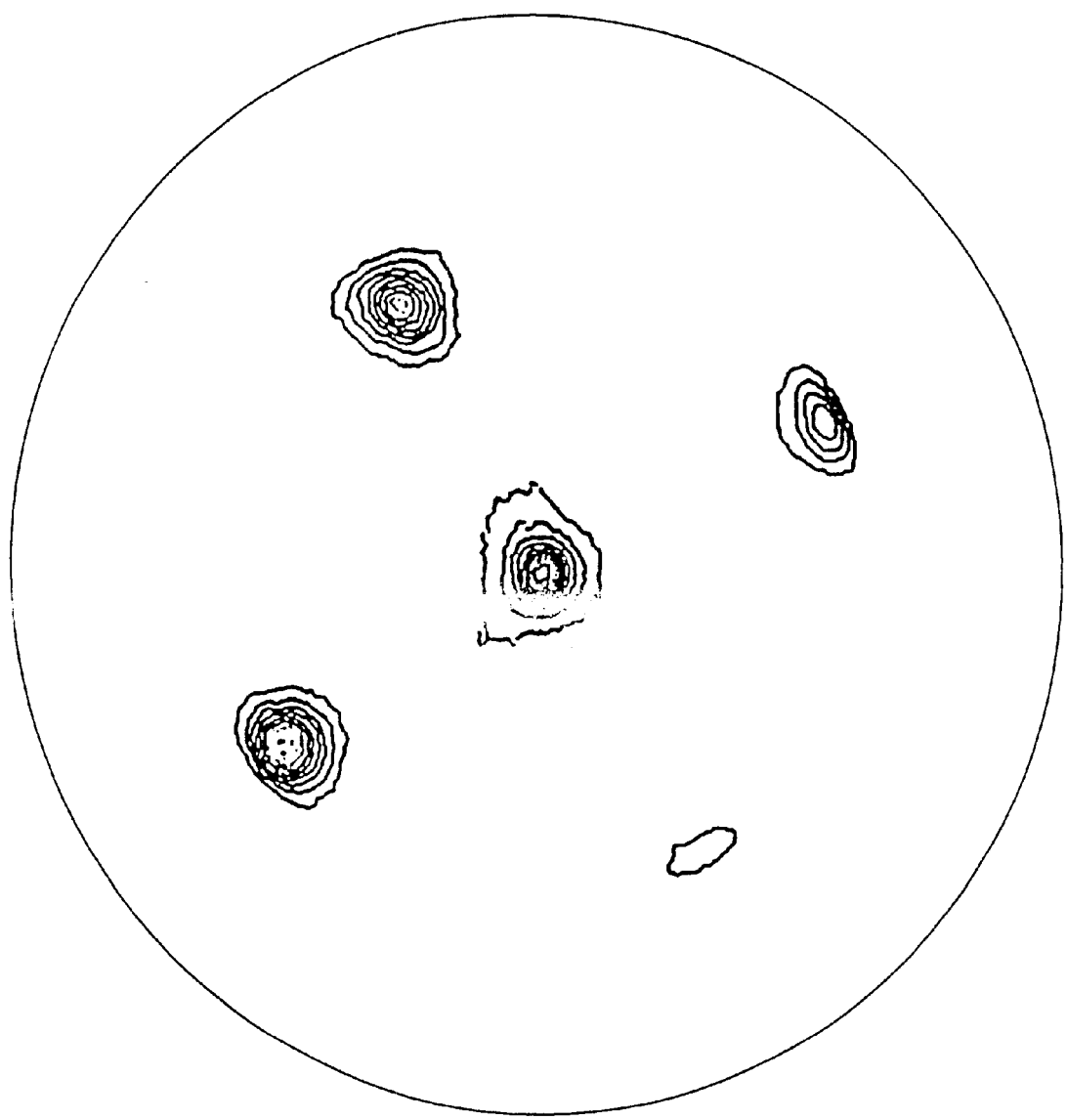
FIG. 8 is an x-ray diffraction pole figure of cerium oxide deposited on single crystal nickel under conditions where uniformly oriented epitaxy does not occur, as seen in Example II.

All samples exhibited a mixed {001}/{111} sheet normal texture in the deposited film. The amount of {001} texture as measured by relative X-ray peak intensities increased with increasing temperature, however the {111} texture was never eliminated. A representative pole figure is shown in FIG. 8. Both sheet texture variants appeared to be formed epitaxially at the highest temperature since very little random in-plane orientations were observed. The full width at half maximum for the {001} variant improved from over 45 degrees to less than 30 degrees with increasing temperature, indicating that higher temperatures may be required to obtain the best quality films. Further efforts to produce a single {001} oriented epitaxial film by temperature increases were curtailed since the results indicated that temperature alone could not eliminate the {111} orientation.

The naturally occurring nickel oxide on a {001} oriented nickel single crystal is the {111} orientation. These results indicated that the elimination of this oxide was advantageous in allowing reliable deposition of {001} oriented epitaxial films on the nickel substrate.

EXAMPLE III

The effect of controlling native oxides at the substrate surface was studied.

A series of experiments were performed to evaluate the combined effects of temperature and the use of hydrogen to control the formation of native surface oxides and subsequent epitaxial growth of oxide films on metallic substrates.

A cerium metal sputtering target was used as the source for the cerium vapor. The substrate was a polished, single crystal nickel with a {001} surface normal. The temperature was varied from 500° C. to approximately 700° C. The hydrogen, which acted as a conditioning gas in the gas beam, content of the argon carrier gas was varied from 2% to nearly 10%. The hydrogen addition was eliminated and replaced with a small amount of oxygen to ensure formation of the stable cerium oxide once an initial oxide film layer was deposited (nucleated) on the metal surface.

The amount of {001} $CeO_2$ texture increased relative to the {111} texture with the addition of 2% hydrogen as temperature increased from 500° C. to 650° C., though the {111} texture was not eliminated. A single, fully epitaxially oriented {001} $CeO_2$ film was produced at 650° C. with hydrogen con(tents of about 4% and about 8%. This established that lower thresholds for both temperature and reactive gas (hydrogen) content exist for the successful high rate deposition of epitaxial oxide films on metallic substrates c without requiring conditioning of the substrate surface and growth of the epitaxial layer in series. Full widths at half maximum for the $CeO_2$ films ranged from 6.8 degrees to 11 degrees at temperatures and hydrogen pressures above the epitaxial threshold (in this case 650° C. at 4% hydrogen, a temperature identical to its epitaxial temperature in a prior art high vacuum process).

EXAMPLE IV

Epitaxial layers were grown on polycrystalline substrates as follows.

Figure 9:
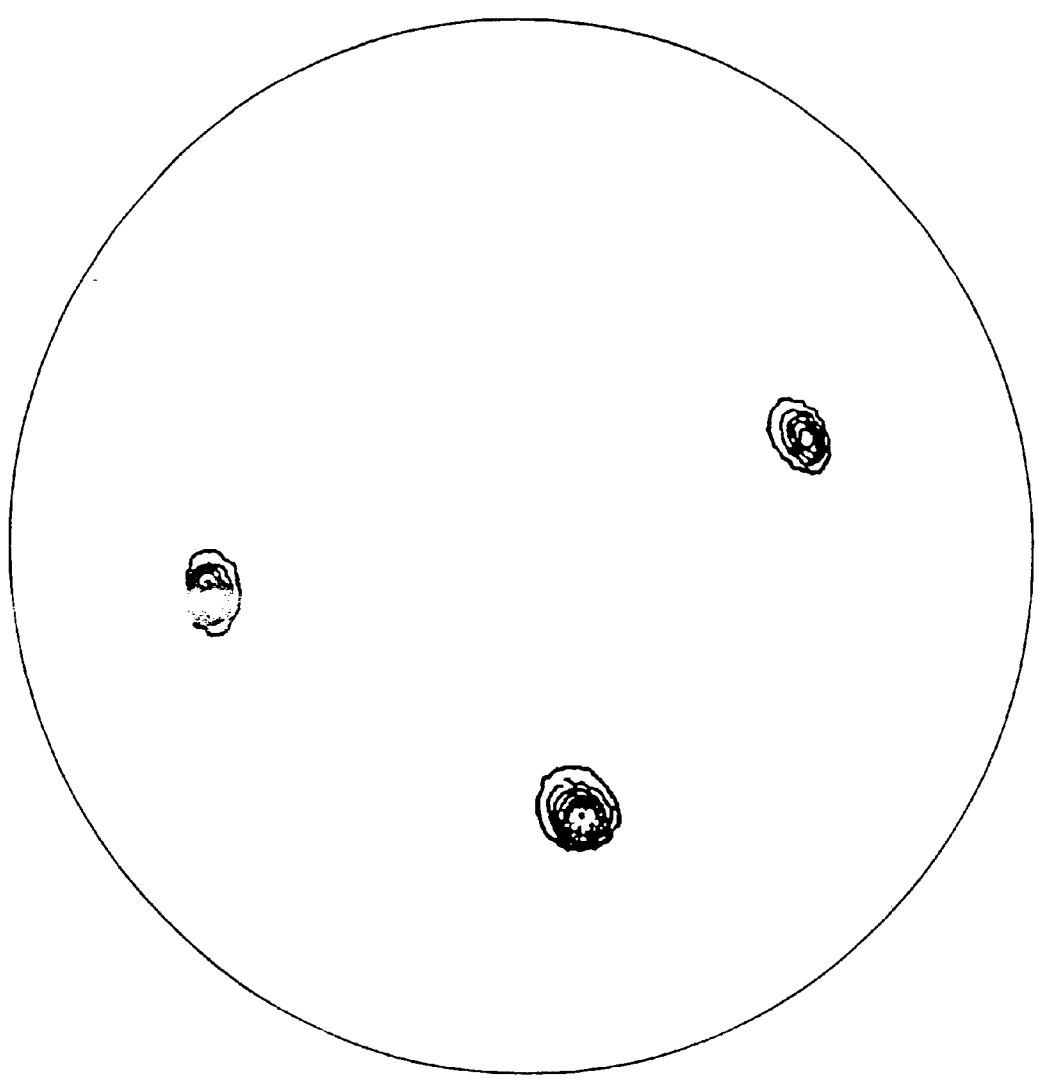
FIG. 9 is an x-ray diffraction pole figure of cerium oxide deposited on crystallographically textured nickel under conditions where epitaxy occurs, as seen in Example IV.

Cerium oxide epitaxial films were deposited following the procedures established in Example III with the exception that the substrates were deformation textured nickel. The full width at half maximum of the nickel substrate was approximately 13 degrees. The epitaxial $CeO_2$ film full width at half maximum was approximately 18 degrees, and its pole figure is shown in FIG. 9. This demonstrated the utility of the developed process for production of tapes.

A $YBa_2Cu_3O_x$ film was deposited on a representative CeO2 buffered, deformation textured nickel tape by spin coating from a metallorganic precursor solution. The film was reacted by controlled heat treatment to form a superconducting oxide film.

EXAMPLE V

Figure 10A:
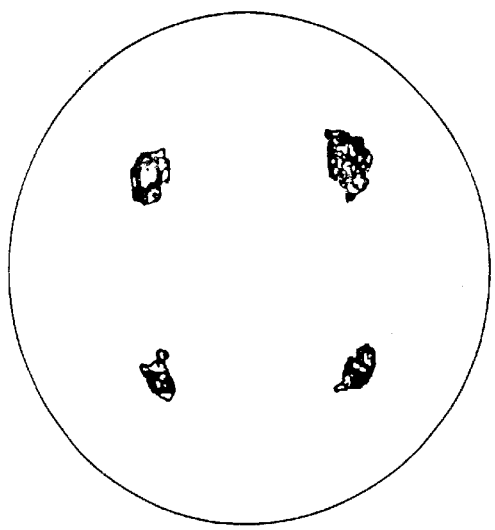
FIGS. 10A–10C are x-ray diffraction pole figures of a nickel substrate, the nickel substrate having a cerium oxide epitaxial layer disposed thereon, and the nickel substrate/ cerium oxide layers having an epitaxial yttria-stabilized zirconia layer disposed thereon.
Figure 10B:
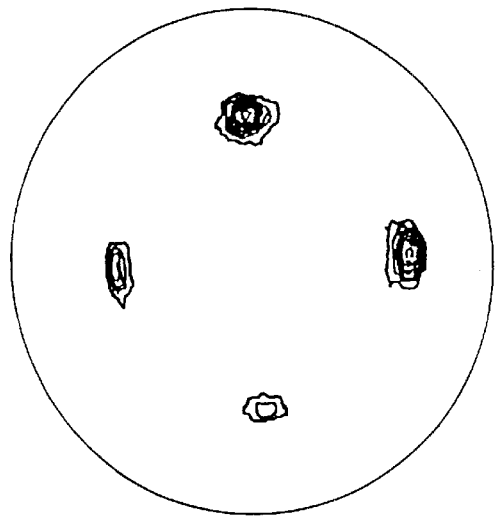
Figure 10C:
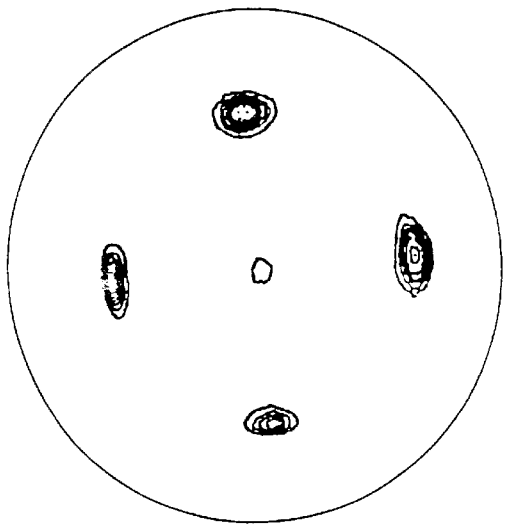

An epitaxial layer of cerium oxide was grown on a nickel substrate according to the procedure of Example III using a nickel substrate temperature of about 650° C. An epitaxial layer of yttria-stabilized zirconia was grown on the cerium oxide layer at a surface temperature of about 700° C. FIGS. 10A–10C show x-ray pole figures of the nickel substrate, the cerium oxide/nickel article and the yttria-stabilized zirconia/cerium oxide/nickel article, respectively. The full widths at half maximum for these figures were 10°, 12° and 10°, respectively.

Micrographs of the epitaxial layer demonstrated a pore density of 130 pores per square millimeter. The micrographs also demonstrated an average second phase particle size of 0.5 micrometers.

EXAMPLE VI

A cerium oxide/yttria-stabilized zirconia/cerium oxide buffer layer stack was formed on a textured nickel substrate by passing argon through a deposition source and hydrogen through a second source such that the partial pressure of hydrogen in the chamber was from about 2 percent to about 4 percent of the total chamber pressure. After an initial treatment of the argon/hydrogen mixture to remove the nickel oxide scale on the substrate, the initial cerium oxide layer was deposited. Yttria-stabilized zirconia was then deposited with argon again passing through the deposition source and oxygen passing through another source such that the partial pressure of oxygen in the chamber was from about 2 percent to about 4 percent of the total chamber pressure. A cerium oxide cap layer was then formed in the same manner as the yttria-stabilized zirconia layer, with argon passing through the deposition source and oxygen passing through the other source. The substrate temperature during the formation of all three layers was from about 500° C. to about 750° C.

A θ-2θ scan showed peak identifications as follows:

| Material | Orientation | Angle | Intensity |
|---|---|---|---|
| Ni | 200 | 51.89 | >8000 |
| YSZ | 200 | 34.89 | 7800 |
| YSZ | 111 | 30.1 | 400 |
| CeO$_2$ | 200 | 33.1 | 2000 |
| CeO$_2$ | 111 | 28.75 | 20 |

EXAMPLE VII

A superconductor layer was deposited on the cerium oxide/yttria-stabilized zirconia/cerium oxide buffer layer of Example V.

The superconductor layer was formed according to the methods disclosed in U.S. Pat. No. 5,231,074 using a trifluoroacetate precursor. The precursor film was spin-coated on a six millimeter by 6 millimeter buffer substrate and decomposed at 400° C. to form a BaF$_2$-containing solid film. The film was heat treated at about 785° C. in 0.1 percent oxygen (balanced by nitrogen). The heat treatment was carried out in the following steps. The first step was performed under a low water vapor pressure of about 0.6 percent relative humidity (220° C.). This step started from 100° C. to ten minutes after reaching 785° C. The second step was performed under a high water vapor pressure of 100 percent relative humidity (22° C. The second step started after 10 minutes at 785° C. and lasted two hours. The third step involved purging with dry 0.1 percent oxygen for ten minutes at 785° C. before cooling down to 435° C., at which the atmosphere is changed to pure oxygen and held for three hours and then slowly cooled down to room temperature.

Figure 11:
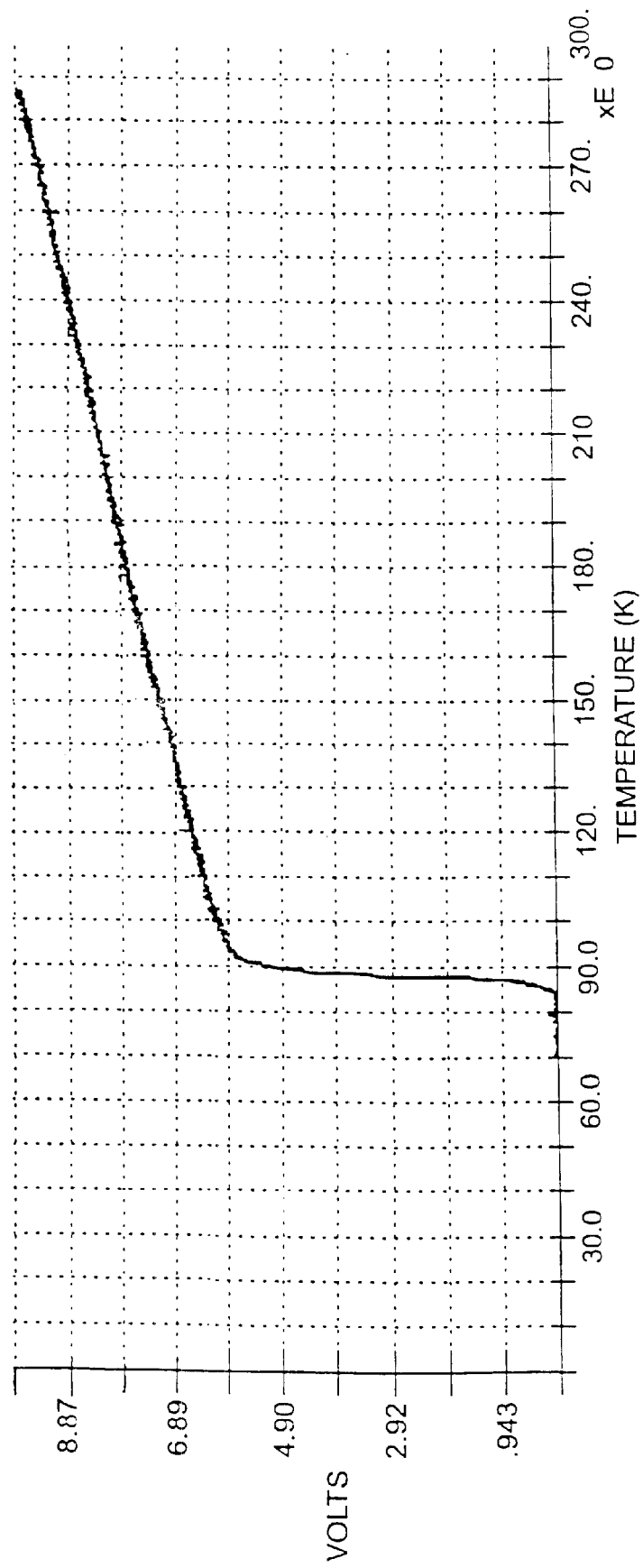
FIG. 11 illustrates the transition temperature of the superconductor of Example 7.

This procedure resulted in a superconductor having a transition temperature as shown in FIG. 11. The superconducting transition temperature was measured using a standard 4-point measurement technique. As shown in FIG. 11, the superconducting transition was clear.

The chamber pressure during growth of the cerium oxide layer and the yttria-stabilized zirconia layer was about 0.1 torr. The temperatures used during the growth of the cerium oxide and yttria-stabilized zirconia layers was comparable to those used for electron beam deposition at a pressure of $1 \times 10^{-5}$ torr. The growth rate achieved for the cerium oxide and yttria-stabilized zirconia layers was about five times higher than typically achieved at a pressure of about $1 \times 10^{-5}$ torr.

Other embodiments are within the claims.

What is claimed is:

1. A method of growing an epitaxial layer on a surface of a substrate, the method comprising the steps of:

exposing the surface of the substrate to a gas having a velocity of at least about one meter per second to grow the epitaxial layer on the surface of the substrate, wherein during the exposing step the substrate has a temperature that is about the same as a PVD epitaxial growth threshold temperature for a chamber pressure of at most about $1 \times 10^{-4}$ torr, the gas becomes a component of the epitaxial layer, the exposing step is performed in a chamber having a pressure of at least about $1 \times 10^{-3}$ torr, and the substrate comprises a material selected from the group consisting of oxides, metals, alloys; and depositing on the epitaxial layer a layer of material selected from the group consisting of superconductor materials and precursors of superconductor materials.

2. The method of claim 1, wherein the substrate comprises a metal.

3. The method of claim 1, wherein the substrate comprises a textured metal.

4. The method of claim 1, wherein the substrate comprises a cube textured metal.

5. The method of claim 1, wherein the substrate comprises an alloy.

6. The method of claim 1, wherein the substrate comprises a textured alloy.

7. The method of claim 1, wherein the substrate comprises a cube textured alloy.

8. The method of claim 1, wherein the substrate comprises an oxide.

9. The method of claim 1, wherein the surface of the substrate has a temperature of from about 25° C. to about 800° C.

10. The method of claim 1, wherein the surface of the substrate has a temperature of from about 500° C. to about 800° C.

11. The method of claim 1, wherein the surface of the substrate has a temperature of from about 500° C. to about 650° C.

12. The method of claim 1, wherein the chamber has a pressure of at least about 0.1 torr.

13. The method of claim 1, wherein the chamber has a pressure of at least about 1 torr.

14. The method of claim 1, wherein the epitaxial layer comprises an oxide.

15. A method of forming an epitaxial layer on a surface of a substrate, the method comprising the step of:

exposing the surface of the substrate to a gas beam having a layer forming gas, wherein at least about 75% of the layer forming gas within the gas beam is incident on the surface of the substrate, and wherein the substrate comprises a material selected from the group consisting of oxides, metals and alloys; and depositing on the epitaxial layer a layer of material selected from the group consisting of superconductor materials and precursors of superconductor materials.

16. The method of claim 15, wherein the substrate comprises a metal.

17. The method of claim 15, wherein the substrate comprises a textured metal.

18. The method of claim 15, wherein the substrate comprises a cube textured metal.

19. The method of claim 15, wherein the substrate comprises an alloy.

20. The method of claim 15, wherein the substrate comprises a textured alloy.

21. The method of claim 15, wherein the substrate comprises a cube textured alloy.

22. The method of claim 15, wherein the substrate comprises an oxide.

23. The method of claim 15, wherein the exposing step is performed in a chamber that has a pressure of at least about 0.1 torr.

24. The method of claim 15, wherein the exposing step is performed in a chamber having a pressure of at least about $1 \times 10^{-3}$ torr.

25. The method of claim 15, wherein a temperature of the conditioned substrate is equal to about a PVD epitaxial growth threshold temperature for a pressure of about $1 \times 10^{-4}$ torr.

26. The method of claim 15, wherein the surface of the substrate has a temperature of from about 25° C. to about 800° C.

27. The method of claim 15, wherein the surface of the substrate has a temperature of from about 500° C. to about 800° C.

28. The method of claim 15, wherein the surface of the substrate has a temperature of from about 500° C. to about 650° C.

29. The method of claim 15, wherein the epitaxial layer comprises an oxide.

30. A method of forming an epitaxial layer on a surface of a substrate, the method comprising the steps of:

exposing the surface of the substrate to a conditioning gas that interacts with surface of the substrate to form a conditioned surface of the substrate; and exposing the conditioned surface of the substrate to a gas beam having a layer forming gas having a velocity of at least about one meter per second, wherein the layer forming gas becomes a component of an epitaxial layer on the conditioned surface of the substrate, the exposing steps are performed in a chamber having a pressure of at least about $1 \times 10^{-3}$ torr, and the substrate comprises a material selected from the group consisting of oxides, metals and alloys; and depositing on the epitaxial layer a layer of material selected from the group consisting of superconductor materials and precursors of superconductor materials.

31. The method of claim 30, wherein the substrate comprises a metal.

32. The method of claim 30, wherein the substrate comprises a textured metal.

33. The method of claim 30, wherein the substrate comprises a cube textured metal.

34. The method of claim 30, wherein the substrate comprises an alloy.

35. The method of claim 30, wherein the substrate comprises a textured alloy.

36. The method of claim 30, wherein the substrate comprises a cube textured alloy.

37. The method of claim 30, wherein the substrate comprises an oxide.

38. The method of claim 30, wherein the pressure of the chamber is at least about 0.1 torr.

39. The method of claim 30, wherein the pressure of the chamber is at least about 1 torr.

40. The method of claim 30, wherein the surface of the substrate has a temperature of from about 25° C. to about 800° C.

41. The method of claim 30, wherein the surface of the substrate has a temperature of from about 500° C. to about 800° C.

42. The method of claim 30, wherein the surface of the substrate has a temperature of from about 500° C. to about 650° C.

43. The method of claim 30, wherein a temperature of the conditioned substrate is equal to about an epitaxial growth threshold substrate temperature for a chamber pressure of about $1 \times 10^{-4}$ torr.

44. The method of claim 30, wherein the epitaxial layer comprises an oxide.

45. A method of growing an epitaxial layer on a surface of a substrate, the method comprising:

exposing, in a chamber having a pressure of at least about $1 \times 10^{-3}$ torr, the surface of the substrate to a gas beam comprising a layer forming gas having a velocity of at least about one meter per second, wherein the substrate comprises a material selected from the group consisting of oxides, metals and alloys; and depositing on the epitaxial layer a layer of material selected from the group consisting of superconductor materials and precursors of superconductor materials.

46. The method of claim 45, wherein the substrate comprises a metal.

47. The method of claim 45, wherein the substrate comprises a textured metal.

48. The method of claim 45, wherein the substrate comprises a cube textured metal.

49. The method of claim 45, wherein the substrate comprises an alloy.

50. The method of claim 45, wherein the substrate comprises a textured alloy.

51. The method of claim 45, wherein the substrate comprises a cube textured alloy.

52. The method of claim 45, wherein the substrate comprises an oxide.

53. The method of claim 45, wherein the gas beam has a velocity of at least about 10 meters per second.

54. The method of claim 45, wherein the gas beam has a velocity of from about 10 meters per second to about 400 meters per second.

55. The method of claim 45, wherein the gas beam has a velocity of from 100 meters per second to about 400 meters per second.

56. The method of claim 45, wherein the chamber has a pressure of at least about 0.1 torr.

57. The method of claim 45, wherein the chamber has a pressure of at least about 1 torr.

58. The method of claim 45, wherein the epitaxial layer comprises an oxide.

59. A method of growing an epitaxial layer on a surface of a substrate, the method comprising:

exposing, in a chamber having a pressure comprising at least about 0.5 percent hydrogen, the surface of the substrate to a gas beam comprising a layer forming gas having a velocity of at least about one meter per second, wherein the layer forming gas becomes a component of the epitaxial layer and the substrate comprises a material selected from the group consisting of oxides, metals and an alloys; and depositing on the epitaxial layer a layer of material selected from the group consisting of superconductor materials and precursors of superconductor materials.

60. The method of claim 59, wherein the substrate comprises a metal.

61. The method of claim 59, wherein the substrate comprises a textured metal.

62. The method of claim 59, wherein the substrate. comprises a cube textured metal.

63. The method of claim 59, wherein the substrate comprises an alloy.

64. The method of claim 59, wherein the substrate comprises a textured alloy.

65. The method of claim 59, wherein the substrate comprises a cube textured alloy.

66. The method of claim 59, wherein the substrate comprises an oxide.

67. The method of claim 59, wherein the chamber has a pressure comprising from about 0.5 percent to about 10 percent hydrogen.

68. The method of claim 59, wherein the chamber has a pressure comprising from about 1 percent to about 8 percent hydrogen.

69. The method of claim 59, wherein the chamber has a pressure comprising from about 2 percent to about 6 percent hydrogen.

70. The method of claim 59, wherein the chamber has a pressure comprising from about 1 percent to about 10 percent hydrogen.

71. The method of claim 59, wherein the epitaxial layer comprises an oxide.

* * * * *